United States Patent [19]

Beale et al.

[11] 3,729,811

[45] May 1, 1973

[54] METHODS OF MANUFACTURING A SEMICONDUCTOR DEVICE

[75] Inventors: Julian Robert Anthony Beale, Reigate; John Anthony Kerr, East Grinstead, both of England

[73] Assignee: U.S. Philips Corporation, New York, N.Y.

[22] Filed: Nov. 30, 1970

[21] Appl. No.: 93,555

[30] Foreign Application Priority Data

Dec. 1, 1969 Great Britain ....................58,514/69

[52] U.S. Cl. ....................................29/578, 148/1.5

[51] Int. Cl. ............................................B01j 17/00

[58] Field of Search ...........................29/578, 576 B; 148/1.5; 317/235

[56] References Cited

UNITED STATES PATENTS

| | | | |
|---|---|---|---|
| 3,413,531 | 11/1968 | Leith | 317/235 |
| 3,622,382 | 11/1971 | Karl | 117/201 |
| 3,655,457 | 4/1972 | Duffy | 148/1.5 |
| 3,515,956 | 6/1970 | Martin et al. | 317/234 |
| 3,534,235 | 10/1970 | Bower et al. | 317/235 |

*Primary Examiner*—Charles W. Lanham
*Assistant Examiner*—W. Tupman
*Attorney*—Frank R. Trifari

[57] ABSTRACT

A method of making a semiconductor device is described which combines ion implantation with another process of forming an impurity-containing semiconductor region. In particular, a surface-adjoining region of a semiconductor is formed in such manner that the portion of that region adjacent the surface is formed by a process other than ion implantation, whereas a surface remote or buried portion of that region which defines a P-N junction is formed by ion implantation. This combination of steps yields improved semiconductor devices.

7 Claims, 6 Drawing Figures

Figure 1:
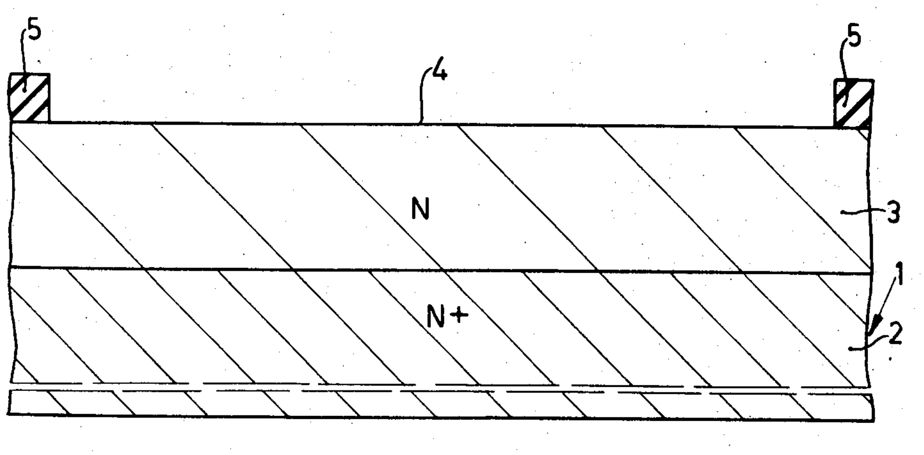

INVENTORS
J. R. A. BEALE &
J. A. KERR
BY
Frank R. Trifari
AGENT

INVENTORS
J. R. A. BEALE &
J. A. KERR
BY

AGENT

*INVENTORS*
J. R. A. BEALE &
J. A. KERR
BY
Frank R. Jinfani
AGENT

METHODS OF MANUFACTURING A SEMICONDUCTOR DEVICE

The invention relates to methods of manufacturing a semiconductor device, comprising the formation of a semiconductor region of one conductivity type which adjoins a surface of a semiconductor body, and further relates to semiconductor devices which can be manufactured by such methods, particularly but not exclusively to semiconductor devices consisting of a high frequency bipolar transistor or a semiconductor integrated circuit including a high frequency bipolar transistor as one of the circuit elements.

In the manufacture of semiconductor devices, comprising the formation of a semiconductor region of one conductivity type which adjoins a surface of a semiconductor body, it is known to provide the region entirely by ion implantation; it is also known to provide such a region by a process other than ion implantation, for example, thermal diffusion or localized epitaxial growth. Furthermore, it is known to provide a surface-adjacent portion of such a region by a process other than ion implantation and to form a lateral extension of the surface-adjacent portion by providing an adjoining, shallow, surface-adjacent portion of the region by ion implantation. Such a known method can be employed in the manufacture of insulated gate field effect transistors, for example, as described in an article by J.M. Shannon et al., Electronics, Feb. 3, 1969, pages 96 to 100; the source and drain regions of the insulated gate field effect transistor are two juxtaposed and mutually spaced semiconductor surface regions of one conductivity type of a semiconductor body; mutually remote, surface-adjacent portions of these two regions which in the manufactured device are highly conductive source and drain contact portions contacted by the source and drain electrodes, are provided by thermally diffusing source and drain impurity atoms; subsequently, source and drain impurity ions are implanted to form mutually adjacent, shallow, surface-adjacent portions of these two regions to determine mutually adjacent extremities of the source and drain regions and thus to define there between the channel region of the insulated gate field effect transistor.

According to the present invention, there is provided a method of manufacturing a semiconductor device, comprising the formation of a semiconductor region of one conductivity type which adjoins a surface of a semiconductor body, in which the major part of the impurity concentration of the one conductivity type of a surface-adjacent portion of the region is provided by a process other than ion implantation, and impurity ions characteristic of the one conductivity type are implanted through the semiconductor body surface to provide the major part of the impurity concentration of the one conductivity type of a substantially layer-shaped, surface-remote portion of the region which extends substantially parallel to the semiconductor body surface, underlies the said surface-adjacent portion, forms a *p-n* junction with an underlying semiconductor body portion of the opposite conductivity type, and separates the said surface-adjacent portion from the said *p-n* junction.

The combination of the ion implantation and a process other than ion implantation enables the exercise of greater control over both the concentration and concentration gradient of impurity atoms of the one conductivity type in portions of the semiconductor region formed at various levels.

Ion implantation permits considerably more precise control of the impurity concentration and concentration gradient at a deeper level within the body than is possible by many processes other than ion implantation. The depth of implantation is determined by the energy of the bombarding impurity ions, while the implanted impurity concentration is determined by the ion dose and bombardment time; these parameters of ion energy, ion dose and bombardment time can be accurately controlled. Thus, the provision by ion implantation of at least the major part of the impurity concentration of the one conductivity type in the surface-remote or buried portion of the region which forms the said *p-n* junction with an underlying semiconductor body portion can be of considerable advantage in the manufacture of semiconductor devices requiring a well-specified impurity concentration and concentration gradient at such a *p-n* junction; in this manner, it is possible to control accurately the position of the said *p-n* junction formed, and to control its shape by controlling the shape of the surface-remote portion in terms of the implanted impurity atom distribution in relation to impurity concentrations already provided or to be provided subsequently. By implantation through an area of ions of a chosen energy value or spectrum, the implanted impurity atoms may have a maximum concentration remote from the surface and so form a buried layer extending substantially parallel to the semiconductor body surface.

However, the impurity concentration and concentration gradient of the one conductivity type required in the surface-adjacent portion of the region may be other than that easily obtainable by ion implantation; for instance, an impurity concentration formed by diffusion may have a higher value at the surface of the body than can be obtained easily by ion implantation, and, for example, such a higher value may be desirable to minimize series resistance between the said-adjacent portion of the region and a metal layer electrode which in the manufactured device contacts the said surface-adjacent portion of the region. Thus, the provision of at least the major part of the impurity concentration of the one conductivity type in the surface-adjacent portion of the region by a process other than ion implantation can be of considerable advantage in the manufacture of certain semiconductor devices.

The implantation of impurity ions to provide an impurity concentration in a semiconductor body portion is to be understood herein to include where appropriate an annealing treatment to restore the semiconductor body crystal lattice damaged by ion beam and to move implanted impurity atoms into substitutional positions in the crystal lattice. Such an annealing treatment can be performed in some cases by heating the body during the ion bombardment. However, it may be performed after the ion bombardment, in which case it will be evident that the location of, and impurity concentrations at, junctions or junctures in the semiconductor body may not be determined until after such an annealing treatment.

During the ion implantation to form the major part of the said impurity concentration of the layer-shaped, surface-remote portion of the region, attention should be given to the well-known phenomenon of ion channeling. For deep implantation with high ion energy, channeling can usually be minimized satisfactorily, as is known, by appropriate orientation of the body crystal lattice to the bombarding ion beam. Thus, the body may have its major surfaces normal to the (111) direction, and the ion beam may be directed towards a major surface of the body at an angle of 7° from the (111) crystal direction. However, in certain cases such orientation is not a sufficient control of ion channeling; thus, for example, when the semiconductor region is a shallow emitter region of a bipolar transistor channeling of ions implanted to form an impurity concentration at the surface-remote portion of the region can occur after scattering of the ions even though such an orientation of the ion beam and body has been made. In such cases, a further attempt may be made to reduce channeling to an acceptable level, for example by a inert ion bombardment to disrupt the semiconductor crystal lattice and occupy lattice channels prior to the impurity ion bombardment. In an alternative form, however, the phenomenon of channeling is intentionally exploited, since towards the end of the channelled ion range in the semiconductor crystal lattice, a maximum implanted impurity concentration occurs at a well-defined depth and has a well-defined steep profile.

The impurity concentration of the one conductivity type provided in part of the layer-shaped surface-remote portion by the ion implantation may be at least one order of magnitude greater than that provided in the said part of the said layer-shaped surface-remote portion by any other process.

The impurity concentration of the one conductivity type in the said layer-shaped surface-remote portion of the region at the said *p-n* junction may be provided substantially wholly by the ion implantation.

The said *p-n* junction formed by the layer-shaped surface-remote portion with the underlying semiconductor body portion may be substantially flat and substantially parallel to the semiconductor body surface.

Processes other than ion implantation that can be employed in appropriate circumstances to provide at least the major part of the said impurity concentration of the said surface-adjacent portion of the region are thermal diffusion of impurity atoms characteristic of the one conductivity type, epitaxial growth of semiconductor material of the one conductivity type, or even "knock-on implantation" of impurity atoms characteristic of the one conductivity type from an impurity layer on the semiconductor body surface; in the latter case, the impurity layer is bombarded by high energy ions which by energy transfer cause impurity atoms from the layer to enter the underlying surface-adjacent portion of the body and be implanted therein.

The term "thermal diffusion of impurity atoms" is to be understood herein to include diffusion from a gaseous stream comprising the impurity for example phosphorus atoms from phosphine, and diffusion from a layer portion comprising the impurity and provided at the semiconductor body surface, for example a silica layer doped with boron and situated on the semiconductor body surface, or a shallow implanted, epitaxial or even alloyed layer comprising the impurity and situated at the semiconductor body surface.

When the semiconductor region of the one conductivity type is formed by diffusion and by subsequent implantation, the impurity concentration and concentration gradient adjacent at least portions of the body surface may be determined to a large extent by diffused impurity element atoms, and the impurity concentration and concentration gradient at other portions in the body may be determined to a large extent by implanted impurity element atoms. The said impurity element atoms may be implanted at a deeper and/or shallower level than diffused impurity element atoms. By such a method it is possible to form a high conductivity implanted layer-shaped portion in and around the active portion of a previously diffused base region of a bipolar transistor; depending on the arrangement, such a high conductivity implanted portion of the base region can serve to reduce base series resistance for high frequency operation and/or to ensure that breakdown current flowing across the emitter-base junction flows across a portion of the junction in the bulk of the semiconductor body rather than across a portion of the junction at the semiconductor body/insulating layer interface causing damage at the interface.

The said *p-n* junction may be the emitter-base junction of a high frequency bipolar transistor, or the collector-base junction. When an emitter region is formed by diffusion from or into a narrow semiconductor body surface portion, the resulting emitter-base junction may have a high curvature; however, by a subsequent implantation stage a substantially flat, active portion of the junction can be formed parallel to the surface, and this flat portion of the junction can reduce the effect of emitter current crowding. In addition, the precise location of the emitter-base and collector-base junction are important for high frequency bipolar transistors, since these locations determine the width of the active base region.

The lateral dimensions of the semiconductor region of the one conductivity type may be determined by the lateral dimensions of a layer or layers provided on the surface portion of the body and acting as a source of impurity element atoms for diffusion and/or implantation techniques mentioned hereinbefore. In another form, the bombarding ions may be in the form of a beam which is directed selectively at the surface portion. In a further form, one or more masking layers may be employed.

When the said process other than ion implantation is thermal diffusion during the said thermal diffusion in the formation of the said surface-adjacent portion of the region, a diffusion masking layer may be present on semiconductor body surface portions, impurity atoms characteristic of the one conductivity type being diffused into the semiconductor body at an opening in the masking layer.

When the said process other than ion implantation is localized epitaxial growth, the said surface-adjacent portion of the region may be provided by epitaxially growing semiconductor material of the one conductivity type on a semiconductor surface portion at an opening in a masking layer provided on semiconductor body surface portions to mask underlying semiconductor body portions against epitaxial growth. In this case, it can be advantageous for impurity element atoms subsequently implanted as described hereinbefore to determine the major portion of the impurity concentration of the one conductivity type in the vicinity of the of the interface between the said surface-adjacent portion provided by epitaxy and the subjoining semiconductor body portion.

The masking layer may be used to mask underlying semiconductor body portions against both the ion implantation and the process other than ion implantation.

The masking layer may be of insulating and surface passivating material, and at least the parts of the masking layer adjacent the opening be retained in the manufactured device.

When the masking layer is used to mask underlying semiconductor body portions against both the ion implantation and the process other than ion implantation, the ion implantation may be effected through the whole of the semiconductor surface portion at the opening in the masking layer. In this case, when the masking layer is of insulating and surface passivating material, and at least the parts of the masking layer adjacent the opening be retained in the manufactured device, after the formation of the semiconductor region the whole of the semiconductor surface portion at the opening in the masking layer may be exposed and a metal layer electrode is provided to contact the said surface-adjacent portion of the region at the opening in the masking layer. Thus, when thermal diffusion is the said process other than ion implantation, although the diffusion and implantation is effected in this case through the same opening, the lateral spread of diffused atoms is considerably greater than that of atoms implanted by ion bombardment, so that when the masking layer is of an insulating and passivating material the whole *p-n* junction formed between the semiconductor region and adjacent portions of the body can terminate at the semiconductor body surface below the passivating layer; thus a metal layer electrode contact can be made to such a semiconductor region at the opening in the masking layer without short-circuiting the *p-n* junction termination; in this manner, a so-called "washed-out" contact may be made. The semiconductor region of the one conductivity type may be an emitter region of a bipolar transistor and the said *p-n* junction an emitter-base *p-n* junction.

Figure 6:
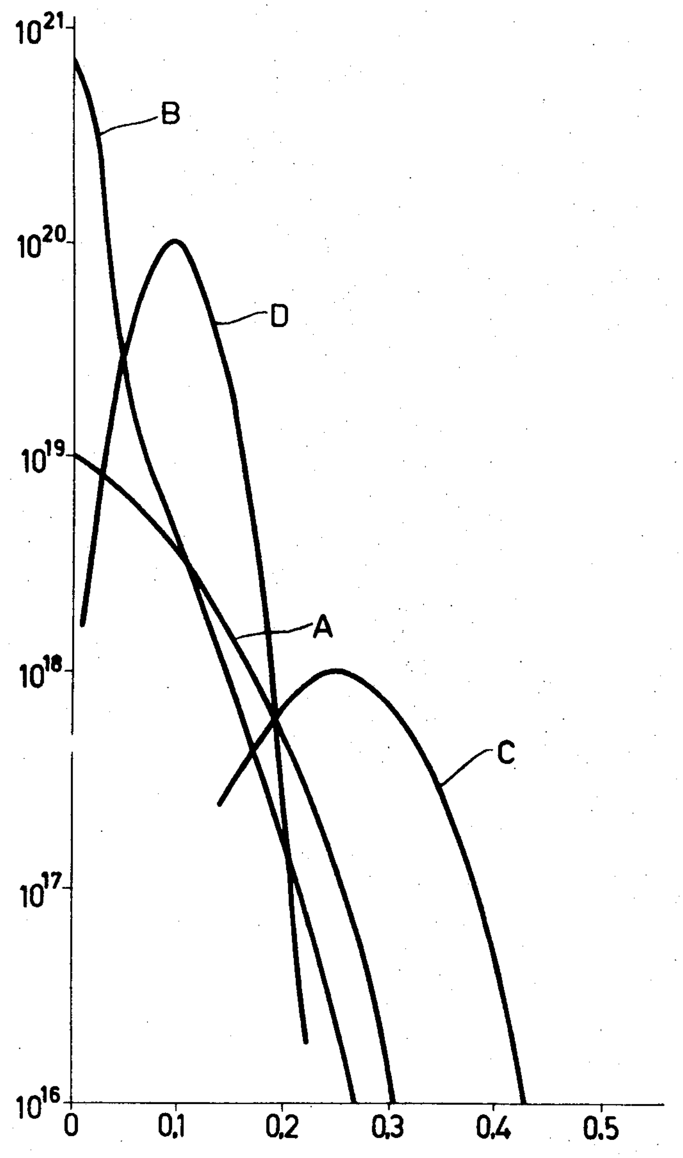

An embodiment of the invention will now be described, by way of example, with reference to the accompanying diagrammatic drawings, in which FIGS. 1 to 5 are cross-sectional views of the semiconductor body of a discrete bipolar transistor at various stages of manufacture, and FIG. 6 is a graph showing impurity element concentration profiles at various regions of the bipolar transistor.

The starting material is an *n*-type monocrystalline silicon body 1, a portion of which is shown in FIG. 1. The body 1 comprises an $n^+$substrate 2 of 0.008 ohm-cm. resistivity and 200 microns thickness on which is provided by epitaxial growth an *n*-type epitaxial layer 3 having a resistivity between 0.5 and 1 ohm-cm. and a thickness between 3 and 5 microns. The body 1 has its major surfaces normal to the ( 1 1 1 ) direction.

In general, several discrete bipolar transistors are manufactured from a common semiconductor wafer by forming an array of transistor elements simultaneously on the wafer and dividing the wafer to form individual semiconductor bodies for each discrete transistor. However, the method of manufacture described herein with reference to FIGS. 1 to 5 will be in terms of the semiconductor body for one discrete transistor rather than the whole semiconductor wafer. It will be evident that where steps such as photolithographic and etching techniques, diffusion, implantation and annealing are referred to, these operations are effected either simultaneously at a plurality of locations on the wafer or to the whole wafer so that a plurality of individual transistor elements are formed which are separated by dividing the wafer at a later stage of manufacture.

A layer of silicon oxide of approximately 0.5 microns thickness is grown on the surface of the epitaxial layer 3 by maintaining the body 1 at 1,200°C in a stream of wet oxygen. By a photolithographic and etching step an opening of 50 microns by 80 microns is formed in the silicon oxide layer to expose surface portion 4 of the underlying epitaxial layer 3 and to form a silicon oxide masking layer pattern 5. The resulting structure is shown in FIG. 1.

The body 1 is placed in a diffusion furnace and maintained at approximately 950°C in a gas stream containing boron which is derived from a boron trioxide source. This results in the thermal diffusion of boron into the exposed surface portion 4 of the epitaxial layer 3 to form in the *n*-type epitaxial layer 3 a p-type region portion 6'. The silicon oxide masking layer pattern 5 masks underlying surface portions of the epitaxial layer 3 against diffusion. The diffused boron surface concentration is of the order of $10^{19}$ atoms c.c. The *p*-type region portion 6' forms a *p-n* junction 7' with adjacent portions of the *n*-type epitaxial layer 3. The precise location of the *p-n* junction 7' and the diffused boron concentration in the vicinity of the junction 7' is not easily determined by the diffusion process. An approximate value for the depth of the *p-n* junction 7' in the epitaxial layer 3 is 0.2 microns.

Figure 2:
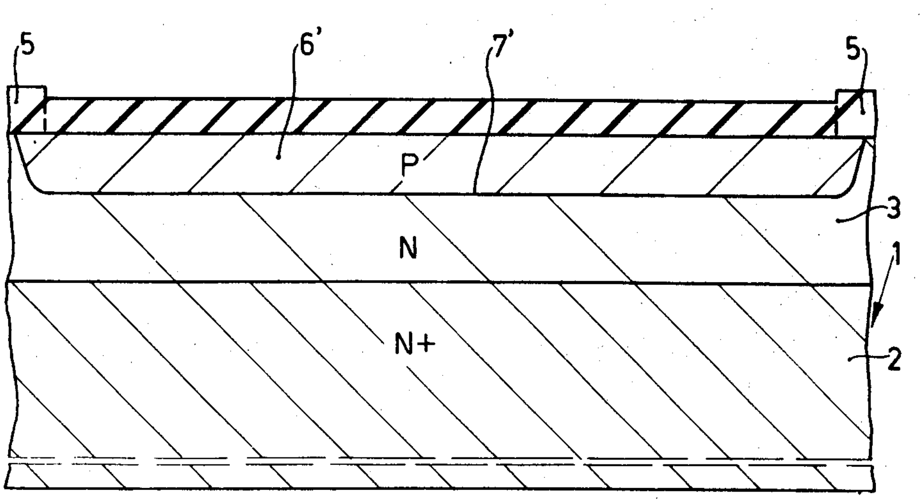
Figure 3:
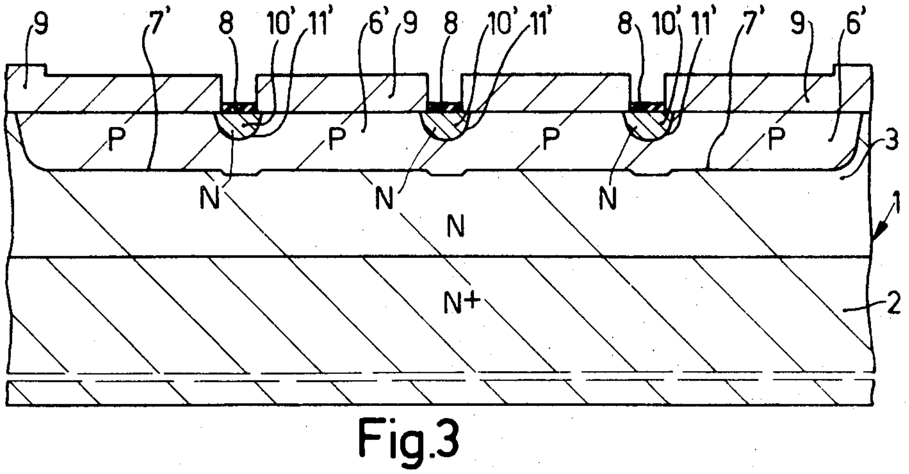

During the boron diffusion the surface portion 4 of the epitaxial layer 3 in the opening in the silicon oxide masking layer pattern 5 becomes covered with a thin layer of borosilicate glass. The body 1 is removed from the diffusion furnace and, after removal of the borosilicate glass, a further silicon oxide layer is grown in the opening in the silicon oxide masking layer pattern 5, which layer pattern 5 is simultaneously thickened. This results in a drive-in of the *p-n* junction 7' to a depth of approximately 0.3 microns. FIG. 2 shows the resulting structure.

By a photolithographic and etching step, three emitter finger openings of 3 microns by 40 microns are made in the silicon oxide layer portion on the surface portion 4 and disposed within the *p*-type diffused region portion 6'. In this manner smaller surface portions 8 of the *p*-type region portion 6' are exposed and a silicon masking layer pattern 9 formed.

The body 1 is placed in a diffusion furnace and maintained at 900°C for 15 minutes in a gas stream containing phosphorus which is derived from phosphine. This results in the diffusion of phosphorus atoms into the exposed surface portions 8 of the *p*-type region portion 6' and the formation of *n*-type region portions 10' adjacent the surface portions 8 and forming *p-n* junctions 11' with the adjacent *p*-type region portion 6'. The silicon oxide masking layer pattern 9 masks adjacent portions of the *p*-type region portion 6' and the epitaxial layer 3 against diffusion. The diffused phosphorus surface concentration is approximately $7 \times 10^{20}$ atoms/c.c. The precise location of the *p-n* junctions 11' and the diffused phosphorus concentration in the vicinity of the junctions 11' is not easily determined by the diffusion process. There is a tendency for an inflexion to occur in the diffused phosphorus concentration profile so resulting in a low phosphorus concentration and concentration gradient in the vicinity of the *p-n* junctions 11'. The depth of the *p-n* junctions 11' is less than 0.2 micron. The phosphorus diffusion results in a so-called "push-out" of the junction 7' to a deeper level. During the diffusion step, a thin layer of phosphosilicate glass is formed on the exposed silicon surface portion 8 and on the surface of the silicon oxide masking layer pattern 9.

The impurity element concentrations and concentration gradients in the vicinity of the *p-n* junctions 7' and 11' are now substantially modified by implantation of boron and phosphorus using ion bombardment techniques. The silicon oxide masking layer pattern 9 serves as a mask against implantation. Aluminum layers of approximately 0.5 to 1 micron thickness may also be employed as masking layer patterns in certain areas.

Figure 4:
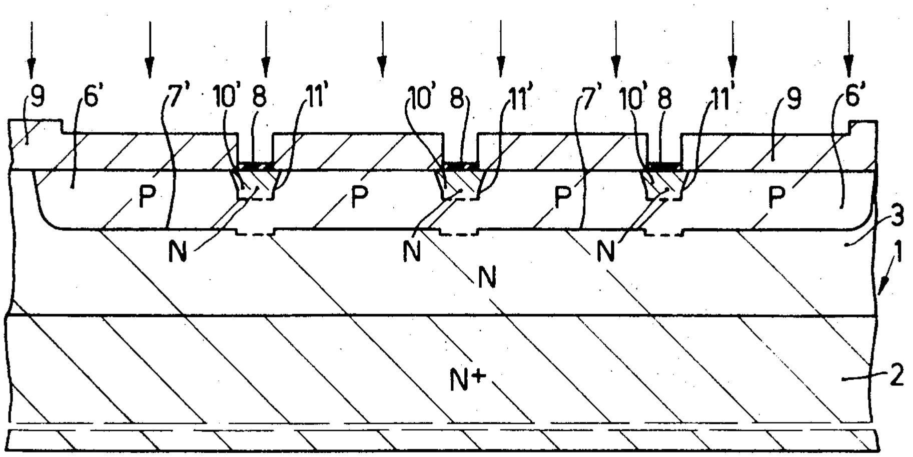
Figure 5:
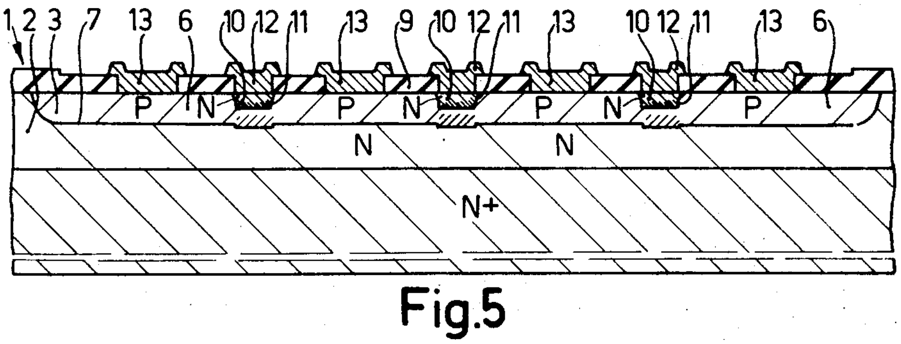

The body 1 is placed in the target chamber of an ion bombardment apparatus and bombarded as indicated by arrows in FIG. 4 first with boron ions and subsequently with phosphorus ions. The boron ion source consists of boron trichloride and the phosphorus ion source of phosphorus trichloride. The orientation of the body 1 is such that there is an angle of 7° between the ion beam axis and the (111) silicon crystal direction.

The boron bombardment is effected in steps either with increasing or decreasing energies in the range of 60 keV to 80 keV. The doses are of the order of $10^{14}$ atoms/cm.$^2$. Implantation of boron in the body occurs through the thin phosphosilicate glass layer on the surface portions 8 at the openings in the silicon oxide masking layer pattern 9. In this manner, the boron concentration in extended areas of the *p*-type region portion 6' in the vicinity of the *p-n* junction 7' below the *n*-type diffused region portion 10' is increased; the major part of the said concentration in the said extended areas is provided by boron atoms implanted through the surface portions 8 by ion bombardment. The diffused and implanted boron atoms together form *p*-type region 6 which has a surface-adjacent portion in which the major part of the boron concentration is provided by thermal diffusion and surface-remote or buried layer-shaped portions which form well-defined flat portions of the collector-base *p-n* junction 7 with the adjacent portion of the *n*-type epitaxial layer 3, and in which the major part of the boron concentration is provided by ion implantation, as indicated by an increase of shading in FIG. 5. The final location of the *p-n* junction 7 and the final boron concentration in the vicinity of *p-n* junction 7 below the *n*-type diffused region 10 are determined during a subsequent low temperature annealing treatment, for example at 800°C. The *p-n* junction 7 so formed constitutes the base-collector *p-n* junction of the transistor, the *p* -type region 6 constituting the base region. The resulting acceptor impurity element concentration in areas of the region 6 in the vicinity of the *p-n* junction 7 and below the *n*-type region portions 10' is determined substantially wholly by boron atoms implanted using ion bombardment. The resulting depth in the body 1 of the portions of the *p-n* junction 7 below the *n* -type region portions 10' is approximately 0.45 micron.

The implantation energy of the phosphorus ions is 80 keV, and the dose is approximately $10^{15}$ atoms/cc.$^2$. Implantation of phosphorus in the body occurs through the thin phosphosilicate glass layer on the surface portions 8 at the openings in the silicon oxide masking layer pattern 9. In this manner, the phosphorus concentration in an extended area of each *n*-type region portion 10' in the vicinity of the *p-n* junctions 11' is increased; the major part of the said concentration in the said extended area is provided by phosphorus atoms implanted through the surface portions 8 by ion bombardment. The diffused and implanted phosphorus atoms together from *n*-type regions 10 each of which has a surface-adjacent portion in which the major part of the phosphorus concentration is provided by thermal diffusion and a surface-remote or buried layer-shaped portion which each form a well-defined flat portion of the emitter-base *p-n* junction 11 with the adjacent portions of the *p*-type base region 6, and in which the major part of the phosphorus concentration is provided by ion implantation, as indicated by an increase of shading in FIG. 5, and as shown each resulting *p-n* junction 11 has a substantially flat portion parallel to the surface portions 8. After a low temperature annealing treatment, for example at 600°C, the depth of the *p-n* junctions 11 in the body 1 is 0.2 microns.

The resulting *n*-type regions 10 and *p-n* junctions 11 constitute the emitter regions and the emitter-base *p-n* junctions respectively of the transistor. Consequently, the resulting base width of the transistor is 0.25 microns.

Various impurity element concentrations profiles are shown in FIG. 6, where the vertical axis represents the impurity concentration in atoms/c.c. and the horizontal axis represents depth from the surface in microns. The diffused boron profile prior to the phosphorus diffusion is designated A; the diffused phosphorus profile is designated B; the implantation profile of 70 keV boron ions is designated C, and the implantation profile of 80 keV phosphorus ions is designated D. It will be evident from FIG. 6 that the locations of the collector-base and emitter-base *p-n* junctions 7 and 11 are determined substantially wholly by implanted boron and phosphorus ions respectively, whereas the impurity element concentrations of the base and emitter regions adjacent the surface are determined substantially wholly by diffused boron and phosphorus atoms respectively.

Portions of the silicon oxide masking layer pattern 9 are retained in the manufactured device as an insulating and passivating layer on the silicon body surface. Contact is made to the *n*-type emitter regions 10 by a so-called "washed-out emitter technique," in which an emitter contact layer is provided in the same openings in the layer pattern 9 as was employed to expose the surface portions 8 for diffusion and implantation. This technique may be employed since the lateral spread of the diffused phosphorus atoms at the surface causes the emitter-base *p-n* junctions 11 to terminate at the surface below the silicon oxide masking layer pattern 9 so preventing a short-circuit across the junction by the emitter contact layer. The thin phosphosilicate glass layer is removed to re-expose the surface portion 8 associated with the *n*-type emitter region 10, by dipping the body 1 in a very weak hydrofluoric acid solution for a few seconds. By a further photolithographic and etching step four openings each of approximately 5 microns by 40 microns are formed in the silicon oxide masking layer pattern 9 to expose surface portions of the *p*-type base region 10.

A layer of aluminum of 0.5 microns thickness is then deposited over the whole surface. The aluminum layer is selectively removed by a further photolithographic and etching step to leave interdigitated emitter and base contact metal layers 12 and 13. The emitter contact layer 12 includes three finger portions of 5 microns width situated in the openings of the silicon oxide layer pattern 9 at the surface portions 8 previously occupied by the phosphosilicate glass layer, and extends over the silicon oxide layer pattern 9 to terminate in a common large area bonding pad on the silicon oxide layer pattern 9. The base contact layer 13 comprises four fingers each of 5 microns width which further extend over the silicon oxide layer pattern 9 to terminate in a common large area bonding pad on the silicon oxide layer pattern 9. The high conductivity substrate 2 provides the collector electrode.

After dividing the wafer, the body 1 comprising the transistor element is mounted in an envelope. Connections to the emitter and base bonding pads are made, and encapsulation is effected in a conventional manner.

It will be evident that in the embodiment described the order of the diffusion and implantation processing steps are chosen such that the temperatures involved are in descending order and the processes are essentially independent.

What we claim is:

1. A method of manufacturing a semiconductor device containing a semiconductor region of one-type conductivity which adjoins the surface of a semiconductor body and also forms a *p-n* junction with an underlying body portion of the opposite-type conductivity, comprising forming on the surface of the body a masking layer having an opening over the one-type region to be formed, introducing through the said opening by a process other than ion implantation one-type-forming impurities to form a surface-adjacent portion of said semiconductor region whose major concentration of one-type-forming impurities is determined by said process other than ion implantation, implanting one-type-forming impurity ions through the same said opening in the masking layer and into a surface-remote portion of the said region to form therein a substantially layer-shaped buried portion which extends substantially parallel to the said surface, which underlies the surface-adjacent part, which extends to the opposite-type underlying body portion thereby defining the said *p-n* junction, and whose major part of its one-type-forming impurities is determined by said implanted ions, exposing the whole of the semiconductor surface portion at the same said opening in the masking layer, and depositing a metal layer electrode to contact the said surface-adjacent portion of the region through the same said opening in the masking layer.

2. A method as claimed in claim 1, wherein the impurity concentration of the one-type conductivity provided in part of the layer-shaped surface-remote portion by the ion implantation is at least one order of magnitude greater than that provided in the said part of the said layer-shaped surface-remote portion by any other process.

3. A method as claimed in claim 2, wherein the impurity concentration of the one-type conductivity in the said layer-shaped surface-remote portion of the region at the said *p-n* junction is provided substantially wholly by the ion implantation.

4. A method as claimed in claim 1, wherein the said process other than ion implantation employed in the formation of the said surface-adjacent portion of the region is thermal diffusion of impurity atoms characteristic of the one-type conductivity.

5. A method as claimed in claim 1, wherein the said process other than ion implantation is localized epitaxial growth, the said surface-adjacent portion of the region being provided by epitaxially growing semiconductor material of the one-type conductivity on a semiconductor surface portion at an opening in a masking layer provided on semiconductor body surface portions to mask underlying semiconductor body portions against epitaxial growth.

6. A method as claimed in claim 1, wherein the masking layer is of insulating and surface passivating material, and at least parts of the masking layer are retained in the manufactured device.

7. A method as claimed in claim 1, wherein the semiconductor region is an emitter region of a bipolar transistor, the said *p-n* junction being an emitter-base junction.

* * * * *